United States Patent
Heinrich et al.

(10) Patent No.: US 9,490,193 B2
(45) Date of Patent: Nov. 8, 2016

(54) ELECTRONIC DEVICE WITH MULTI-LAYER CONTACT

(75) Inventors: Alexander Heinrich, Regensburg (DE); Michael Juerss, Regenstauf (DE); Konrad Roesl, Teublitz (DE); Oliver Eichinger, Regensburg (DE); Kok Chai Goh, Regensburg (DE); Tobias Schmidt, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 13/309,163

(22) Filed: Dec. 1, 2011

(65) Prior Publication Data

US 2013/0140685 A1   Jun. 6, 2013

(51) Int. Cl.
*H01L 29/43* (2006.01)
*H01L 29/45* (2006.01)
(Continued)

(52) U.S. Cl.
CPC ..... *H01L 23/4827* (2013.01); *H01L 23/49513* (2013.01); *H01L 24/03* (2013.01); *H01L 24/05* (2013.01); *H01L 24/08* (2013.01); *H01L 24/27* (2013.01); *H01L 24/29* (2013.01); *H01L 24/32* (2013.01); *H01L 24/83* (2013.01); *H01L 29/43* (2013.01); *H01L 29/45* (2013.01); *H01L 2224/0345* (2013.01); *H01L 2224/03438* (2013.01); *H01L 2224/04026* (2013.01); *H01L 2224/05083* (2013.01); *H01L 2224/05124* (2013.01); *H01L 2224/05139* (2013.01); *H01L 2224/05166* (2013.01); *H01L 2224/05171* (2013.01); *H01L 2224/05184* (2013.01); *H01L 2224/05639* (2013.01); *H01L 2224/05644* (2013.01); *H01L 2224/05647* (2013.01); *H01L 2224/05655* (2013.01); *H01L 2224/05669* (2013.01); *H01L 2224/08503* (2013.01); *H01L 2224/2745* (2013.01); *H01L 2224/291* (2013.01); *H01L 2224/29082* (2013.01); *H01L 2224/29105* (2013.01); *H01L 2224/29109* (2013.01);
(Continued)

(58) Field of Classification Search
CPC .............................. H01L 29/43; H01L 29/45
USPC ........ 257/750, 751, 753, 762, 765, E23.021, 257/E29.139, E29.159; 438/597, 614, 652, 438/666
See application file for complete search history.

(56) References Cited

U.S. PATENT DOCUMENTS

2001/0008224 A1*  7/2001  Woolsey et al. ................ 216/13
2002/0157247 A1* 10/2002  Li .................................. 29/840
(Continued)

FOREIGN PATENT DOCUMENTS

DE          19603654 C1     7/1997
DE          10124141 A1     4/2002
(Continued)

OTHER PUBLICATIONS

English machine translation of DE 103 39 462 to Bergmann et al.*

*Primary Examiner* — Eduardo A Rodela
*Assistant Examiner* — Christopher M Roland
(74) *Attorney, Agent, or Firm* — Slater Matsil, LLP

(57) ABSTRACT

The electronic device includes a carrier, a semiconductor substrate attached to the carrier, and a layer system disposed between the semiconductor substrate and the carrier. The layer system includes an electrical contact layer disposed on the semiconductor substrate. A functional layer is disposed on the electrical contact layer. An adhesion layer is disposed on the functional layer. A solder layer is disposed between the adhesion layer and the carrier.

6 Claims, 4 Drawing Sheets

(51) Int. Cl.
  *H01L 23/482* (2006.01)
  *H01L 23/00* (2006.01)
  *H01L 23/495* (2006.01)

(52) U.S. Cl.
  CPC ............. *H01L2224/29111* (2013.01); *H01L 2224/29113* (2013.01); *H01L 2224/29118* (2013.01); *H01L 2224/29139* (2013.01); *H01L 2224/29144* (2013.01); *H01L 2224/32225* (2013.01); *H01L 2224/32245* (2013.01); *H01L 2224/32503* (2013.01); *H01L 2224/32507* (2013.01); *H01L 2224/8346* (2013.01); *H01L 2224/83191* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83469* (2013.01); *H01L 2224/83815* (2013.01); *H01L 2924/01327* (2013.01); *H01L 2924/1305* (2013.01); *H01L 2924/13055* (2013.01); *H01L 2924/13091* (2013.01); *H01L 2924/1461* (2013.01)

(56) References Cited

U.S. PATENT DOCUMENTS

| | | | |
|---|---|---|---|
| 2003/0214036 A1* | 11/2003 | Sarihan et al. | 257/738 |
| 2005/0239270 A1* | 10/2005 | Fehrer et al. | 438/463 |
| 2006/0006510 A1* | 1/2006 | Koduri | 257/678 |
| 2006/0160267 A1* | 7/2006 | Hur et al. | 438/106 |
| 2006/0292849 A1* | 12/2006 | Mueller et al. | 438/614 |
| 2007/0025684 A1 | 2/2007 | Otremba | |
| 2007/0131734 A1* | 6/2007 | Hosseini et al. | 228/101 |
| 2008/0251927 A1* | 10/2008 | Zhao et al. | 257/762 |
| 2011/0006409 A1* | 1/2011 | Gruenhagen et al. | 257/666 |

FOREIGN PATENT DOCUMENTS

| | | |
|---|---|---|
| DE | 10350707 A1 | 11/2004 |
| DE | 10339462 A1 * | 3/2005 |

\* cited by examiner

ELECTRONIC DEVICE WITH MULTI-LAYER CONTACT

TECHNICAL FIELD

The present invention relates to an electronic device and a method for fabricating an electronic device.

BACKGROUND

For fabricating electronic devices, very often semiconductor chips, semiconductor dies, semiconductor substrates or semiconductor wafers are mounted onto carriers like, for example, leadframes. At present the only available highly conductive attach material for power semiconductor chips with high temperature cycling and high temperature storage reliability is the AuSn diffusion solder die attach. Here the die attach material is an AuSn alloy with an Au composition of roughly 80%. Therefore the AuSn solution is limited to a low solder layer thickness due to the high costs which usually leads to a challenging die attach process.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
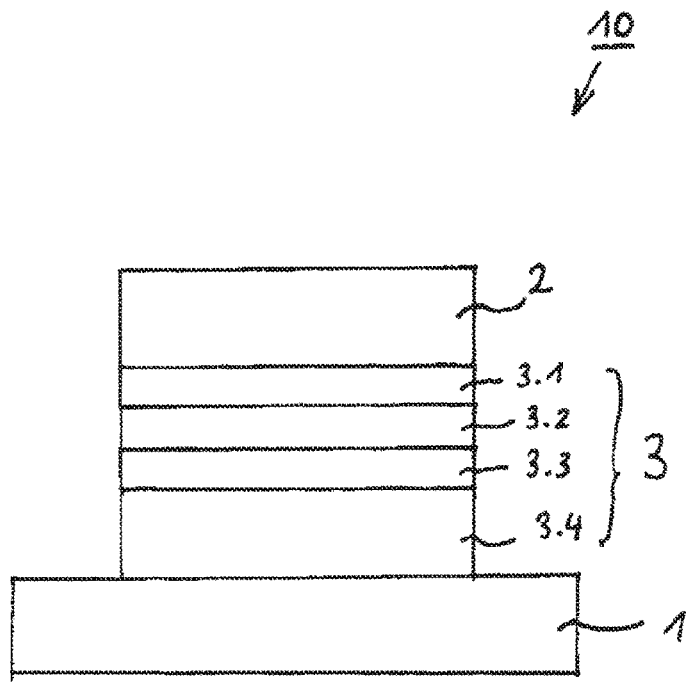
FIG. 1 shows a schematic cross-sectional side view representation of an electronic device according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and a method for fabricating an electronic device may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact terminal is arranged on a first main face of the semiconductor chip and at least one other electrical contact terminal is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole, such as, for example, laminating techniques as well as techniques in which layers are deposited in a sequential manner like, for example, sputtering, plating, molding, CVD, etc.

Referring to FIG. 1, there is shown a schematic cross-sectional side view representation of an electronic device according to an embodiment. The electronic device 10 of FIG. 1 comprises a carrier 1 having a metallic surface, a semiconductor substrate 2, and a layer system 3 disposed between the semiconductor substrate 2 and the carrier 1. The layer system 3 comprises an electrical contact layer 3.1 disposed on the semiconductor substrate 2, a functional layer 3.2 disposed on the electrical contact layer 3.1, an adhesion layer 3.3 disposed on the functional layer 3.2, and a solder layer 3.4 disposed between the adhesion layer 3.3 and the carrier 1.

According to an embodiment of the electronic device 10, the semiconductor substrate 2 is comprised of a silicon-based semiconductor material, e.g., a substrate made from Si, SiC, or another silicon-based material or a compound semiconductor material like, for example, a III-V-material like, for example, GaN. The semiconductor substrate may comprise at its lower surface an electrical contact terminal formed by a highly doped $n^+$ or $p^+$ region.

According to an embodiment of the electronic device 10, the electrical contact layer 3.1 comprises a single element layer of Al, Ti, Ag, or Cr, or an alloy containing one or more of these elements and possibly further elements.

According to an embodiment of the electronic device 10, the functional layer 3.2 is comprised of a barrier layer. In particular the functional layer is comprised of a material like Ti, TiW, or W, or alloys containing one or more of these materials.

According to an embodiment of the electronic device 10, the adhesion layer 3.3 comprises a single element layer of Cu, Au, Ag, Pt, or Ni, or an alloy containing one or more of these elements and possibly further elements.

According to an embodiment of the electronic device 10, the solder layer 3.4 comprises a single element layer of Sn, Zn, In, Ga, Bi, or Cd, or an alloy containing one or more of these elements and possibly further elements.

According to an embodiment of the electronic device 10, the solder layer 3.4 comprises a single element solder material, which is not prone to phase formation during deposition. In addition the solder material itself can be noble metal free, therefore being significantly cheaper. Due to the lower cost, it can be applied much thicker than AuSn, thereby making the die attach process itself easier. Dependent on the solder material the soldering temperature can additionally be decreased significantly, leading to a higher reliability due to less stress being incorporated into the solder interconnect by the isothermal solidification of the solder material.

According to an embodiment of the electronic device 10, the carrier 1 is comprised of a metal carrier and is in particular comprised of Cu, Ni, or Fe, or of an alloy containing one or more of these elements and possibly further elements.

According to an embodiment of the electronic device 10, the carrier 1 is coated with one or more metal layers. In this case the carrier 1 itself can be comprised of a non-metallic carrier like, for example, a carrier made of a ceramic material like aluminum oxide. In particular, the uppermost metal layer is comprised of Au, Ag, Cu, Pd, or Pt, or an alloy of one or more of these elements.

According to an embodiment of the electronic device 10, intermetallic phases are formed between the carrier 1 and the solder layer 3.4 or between a metal layer disposed on the carrier 1 and the solder layer 3.4.

According to an embodiment of the electronic device 10, intermetallic phases are formed between the adhesion layer 3.3 and the solder layer 3.4.

According to an embodiment of the electronic device 10, the adhesion layer 3.3 and surface of the carrier 1 or the surface of a metal layer coated on the carrier surface are formed of the same base material. In particular, the base material is comprised of Cu, Ag, NiV, Ni, or NiNiP.

According to an embodiment of the electronic device 10, the carrier 1 is comprised of a leadframe.

According to an embodiment of the electronic device 10, the layer system 3 is free of Au.

According to an embodiment of the electronic device 10, the semiconductor substrate 2 has a thickness in a range from 5 μm to 500 μm.

According to an embodiment of the electronic device 10, the electrical contact layer 3.1 has a thickness in a range from 100 nm to 1 μm.

According to an embodiment of the electronic device 10, the functional layer 3.2 has a thickness in a range from 50 nm to 200 nm.

According to an embodiment of the electronic device 10, the adhesion layer 3.3 has a thickness in a range from 200 nm to 2 μm.

According to an embodiment of the electronic device 10, the solder layer 3.4 has a thickness in a range from 1 μm to 5 μm.

It should be noted that the above thickness ranges cover also all incremental values.

It has been found that good results can be obtained when the adhesion layer 3.3 and the surface of the carrier 1, i.e., either the base material of the carrier 1 or an uppermost metal layer coated onto the carrier 1, consist of the same base material, e.g., Cu/Cu, Ag/Ag, NiV/Ni, or NiV/NiNiP, which yields in a binary or quasi-binary alloy system, forming a characteristic layer structure in the solder interconnect. The layer structure basically represents the phase fractions indicated in a binary alloy phase diagram, the structure is comparable to a two-sided diffusion couple of, in this case, Cu/Sn.

Figure 2A:
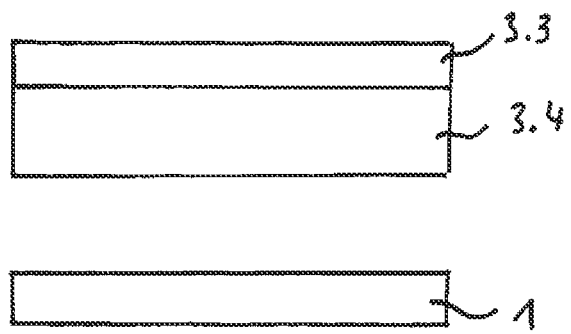
FIGS. 2a and 2b show schematic cross-sectional side view representations for illustrating essential mechanisms of the bonding process.
Figure 2B:
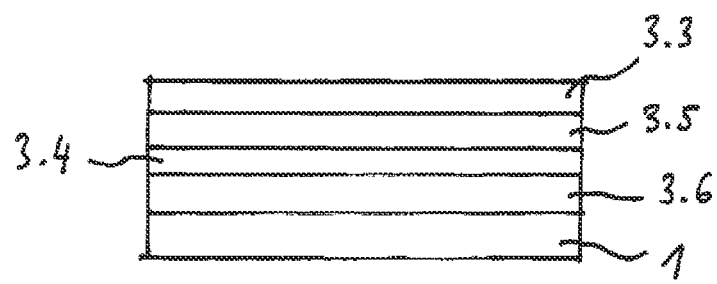

Referring to FIGS. 2a, 2b there are shown schematic cross-sectional side view representations in order to illustrate a layer structure according to an embodiment in order to illustrate the bonding mechanism. In FIG. 2a the carrier 1 is shown and from the layer stack 3 only the adhesion layer 3.3 and the solder layer 3.4 are shown before the bonding process. FIG. 2b shows the layer structure after the bonding process. It can be seen that on either sides of the solder layer 3.4 intermetallic phase layers have developed. In FIG. 2b, a first intermetallic phase layer 3.5 is formed between the adhesion layer 3.3 and the solder layer 3.4 and a second intermetallic phase layer 3.6 is formed between the solder layer 3.4 and the carrier 1. The first intermetallic phase layer 3.5 is rich of the metal of the adhesion layer 3.3 and the second intermetallic phase layer 3.6 is rich of the metal of the surface of the carrier 1. The residual intermediate solder layer 3.4 is still rich of the metal of the original solder layer 3.4. If the materials of the carrier 1 and the adhesion layer 3.3 are the same and also dependent on the layer's thicknesses it is also possible that only one homogeneous layer of an alloy phase is formed instead of the solder layer 3.4, the first intermetallic phase layer 3.5 and the second intermetallic phase layer 3.6. Dependent on the used material combination it is also possible that more than two different layers form within the interconnection.

Figure 3:
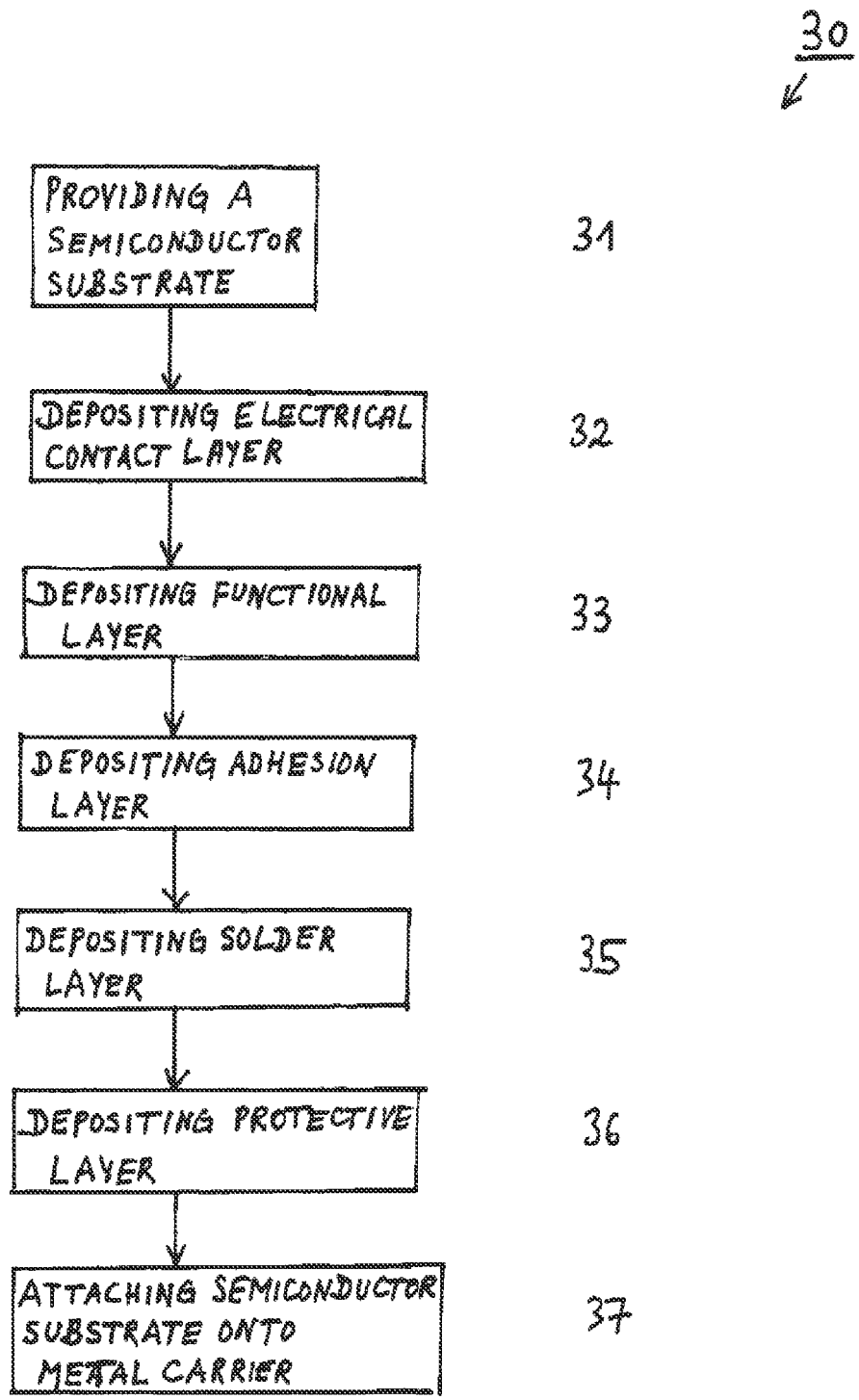
FIG. 3 shows a flow diagram for illustrating a method for fabricating an electronic device according to an embodiment.

Referring to FIG. 3, there is shown a flow diagram for illustrating a method for fabricating an electronic device according to an embodiment. The method 30 comprises providing a semiconductor substrate (31), depositing an electrical contact layer onto the semiconductor substrate (32), depositing a functional layer onto the electrical contact layer (33), depositing an adhesion layer onto the functional layer (34), depositing a solder layer onto the adhesion layer (35), depositing a protective layer onto the solder layer (36), and attaching the semiconductor substrate onto a carrier (37).

According to an embodiment of the method 30, the method further comprises depositing one or more of the electrical contact layer, the functional layer, the adhesion layer, the solder layer, and the protective layer by physical vapor deposition or sputtering, in particular within one and the same processing apparatus.

According to an embodiment of the method 30, the electrical contact layer is comprised of an Al or Ti layer, the functional layer is comprised of a Ti, TiW or W layer, the adhesion layer is comprised of a Cu or Ag layer, the solder layer is comprised of an Sn layer, and the protective layer is comprised of an Ag or Au layer.

Further embodiments of the method 30 can be formed by incorporating into FIG. 3 any feature described above in connection with the embodiments of FIGS. 1 and 2.

Figure 4:
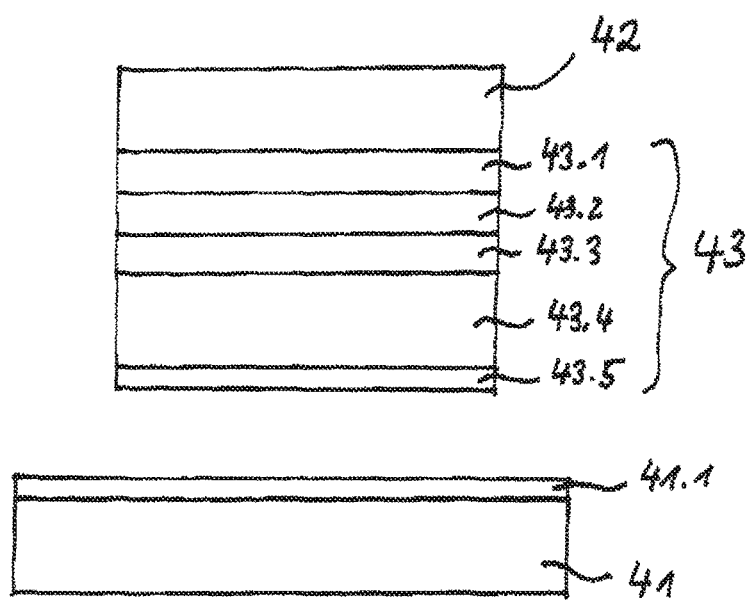
FIG. 4 shows a schematic cross-sectional side view representation of a carrier and a semiconductor substrate together with a layer stack in order to illustrate a method for fabricating an electronic device according to an embodiment.

FIG. 4 shows a schematic cross-sectional side view representation of a carrier and a semiconductor substrate together with a layer stack in order to illustrate a method for fabricating an electronic device according to an embodiment. FIG. 4 shows essentially a carrier 41, in particular a leadframe, and a semiconductor substrate 42 which is to be bonded to the carrier 41. For that purpose a layer stack 43 is deposited subsequently onto the lower surface of the semiconductor substrate 42. In a first step an electrical contact layer 43.1 is deposited onto the lower surface of the semiconductor substrate 42. In a second step a functional layer 43.2 is deposited onto the electrical contact layer 43.1. In a third step an adhesion layer 43.3 is deposited onto the functional layer 43.2. In a forth step a solder layer 43.4 is deposited onto the adhesion layer 43.3. In a fifth step a protective layer 43.5 is deposited onto the solder layer 43.4. The deposition processes can be carried out by physical vapor deposition or sputtering.

According to an embodiment, the protective layer 43.5 has a thickness in a range from 50 nm to 300 nm. Hence the protective layer 43.5 can be made so thin that it practically vanishes in the final product such as that shown in FIG. 1. The protective layer 43.5 prevents an oxidation of the solder layer 43.4.

In the embodiment of FIG. 4 one or more metal layers 41.1 are deposited onto the carrier 41. The metal layer 41.1 or the uppermost metal layer in case of two or more metal layers is comprised of Au, Ag, Cu, Pd, or Pt, or an alloy of one or more of these elements.

Finally, after fabricating the layer stack 43 on the semiconductor substrate 42, the semiconductor substrate 42 is bonded together with the layer stack 43 onto the upper surface of the carrier 41 or the upper surface of the uppermost metal layer 41.1, respectively.

It should be added that the system composed of the semiconductor substrate 42 and the layer stack 43 can be soldered at a die attach temperature of 300° C., leading to a lower die attach stress compared to the 350° C. where the AuSn solder layer currently is attached.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic device comprising:
a carrier having one or more metallic layers disposed on its surface, wherein the metallic layer or an uppermost of the metallic layers, respectively, comprises one or more of Cu, Pt, or Ag;
a semiconductor substrate attached to the carrier; and
a layer system disposed between the semiconductor substrate and the carrier, the layer system comprising:
an electrical contact layer disposed directly on the semiconductor substrate, wherein the electrical contact layer is a layer of a single element Ti;
a functional layer disposed directly on the electrical contact layer, wherein the functional layer is a TiW layer;
an adhesion layer disposed directly on the functional layer, wherein the adhesion layer is a single element layer of Cu, Au, Ag or Ni;
a solder layer disposed directly on the adhesion layer, wherein the solder layer is a single element layer of Zn, In, Ga, Bi, or Cd, or an alloy containing one or more of Zn, In, Ga, Bi, or Cd; and
a protection layer disposed directly on the solder layer and directly adjoining the metallic layer or the uppermost of the metallic layers, respectively, on the surface of the carrier, wherein the protection layer is an Ag layer.

2. The electronic device according to claim 1, wherein the electrical contact layer has a thickness in a range from 100 nm to 1 μm.

3. The electronic device according to claim 1, wherein the functional layer has a thickness in a range from 50 nm to 200 nm.

4. The electronic device according to claim 1, wherein the solder layer has a thickness in a range from 1 μm to 5 μm.

5. The electronic device according to claim 1, wherein the protection layer has a thickness in a range from 50 nm to 200 nm.

6. An electronic device comprising:
a carrier having one or more metallic layers disposed on its surface, wherein the metallic layer or an uppermost of the metallic layers, respectively, comprises one or more of Cu, Pt, or Ag;
a semiconductor substrate attached to the carrier; and
a layer system disposed between the semiconductor substrate and the carrier, the layer system comprising:
an electrical contact layer disposed directly on the semiconductor substrate, wherein the electrical contact layer is a single Ti layer;
a functional layer disposed directly on the electrical contact layer, wherein the functional layer is a Ti layer or a W layer;
an adhesion layer disposed directly on the functional layer, wherein the adhesion layer is a single element layer of Cu, Au, Ag, or Ni;
a solder layer disposed directly on the adhesion layer, wherein the solder layer is a single element layer of Zn, In, Ga, Bi, or Cd, or an alloy containing one or more of Zn, In, Ga, Bi, or Cd; and
a protection layer disposed directly on the solder layer and directly adjoining the metallic layer or the uppermost of the metallic layers, respectively, on the surface of the carrier, wherein the protection layer is an Ag layer.

* * * * *